Aug. 20, 1957 H. JACOBS ET AL 2,803,569
FORMATION OF JUNCTIONS IN SEMI-CONDUCTORS
Filed Dec. 3, 1953
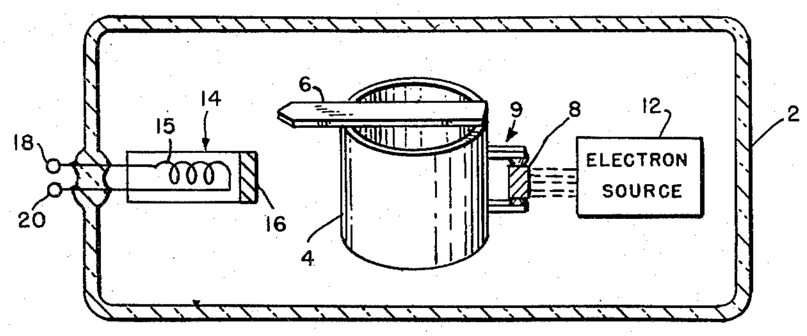
INVENTORS
HOROLD JACOBS
JACK R. LEIBOWITZ
ALEXANDER P. RAMSA
BY Harry M. Saragovitz
ATTORNEY United States Patent Office 2,803,569

Patented Aug. 20, 1957

2,803,569

FORMATION OF JUNCTIONS IN SEMICONDUCTORS

Harold Jacobs, West Long Branch, Jack R. Leibowitz, Asbury Park, and Alexander P. Ramsa, Neptune, N. J., assignors to the United States of America as represented by the Secretary of the Army Application December 3, 1953, Serial No. 396,088

9 Claims. (Cl. 148—1.5)

(Granted under Title 35, U. S. Code (1952), sec. 266)

The invention described herein may be manufactured and used by or for the Government for governmental purposes, without the payment of any royalty thereon.

This invention relates to semiconductors and more particularly to a method for providing a silicon semiconductor body having a predetermined type conductivity.

In translating devices employing semiconductive materials such as transistors, diodes, and the like, the practice has been to utilize as the semiconductor body, a block of extremely pure germanium having a stated percentage of a significant impurity therein. For example, to provide a germanium body of N-type conductivity, the significant impurity may be one of the pentavalent elements whereas a germanium body of P-type material will contain a significant impurity consisting of one of the trivalent elements. However, germanium translating devices do not have stable temperature characteristics above 80° C. and, thus, their use is precluded in those situations where stable characteristics at higher temperatures are desired.

It is known that silicon is a semiconductive material which may be used in place of germanium in semiconductor translating devices to provide stable temperature characteristics at a much higher and wider range of temperatures. However, heretofore, the use of silicon has been limited due to its difficulty of purification and the impracticability of diffusion techniques in the incorporation of a significant impurity thereinto. One of the outstanding difficulties usually confronted is the ready formation of oxides and carbonates of silicon on the surface. These compounds, in addition to affecting the electrical characteristics of silicon in a detrimental manner, act as a surface barrier to prevent the ready diffusion of impurities.

It is, accordingly, an object of the present invention to provide a method for preparing a silicon semiconductor body having a surface free of oxides and carbonates.

Another object is to provide a method for preparing a silicon semiconductor body having a predetermined type conductivity imparted thereto by the incorporation of a significant impurity therein.

A further object is to provide a method for preparing a silicon semiconductor body having a plurality of adjoining zones, of alternating type conductivity.

In accordance with the present invention, there is provided a method of providing a silicon semiconductor body having a predetermined type conductivity comprising subjecting the surface of a silicon block to an electron bombardment in a vacuum to remove oxides and other contaminating materials from the surface, evaporating, in said vacuum, a predetermined impurity selected from the group consisting of the trivalent and pentavalent elements on to the bombarded surface whereby the impurity diffuses into the body imparting a predetermined type conductivity thereto, and thereafter again bombarding the surface with electrons to remove the excess of evaporated impurity therefrom.

Also, in accordance with the present invention there is provided a method of providing a silicon semiconductor body having alternating zones of different type conductivity comprising subjecting a silicon block having a first type of conductivity to an electron bombardment in a vacuum to remove oxides and other contaminating materials from the surface, evaporating on to the bombarded surface in said vacuum, a predetermined impurity which imparts an opposite type conductivity to the block, the impurity diffusing into the body to form a zone of opposite conductivity in junction with a zone of first type conductivity, and thereafter subjecting the surface to an electron bombardment to remove the excess impurity therefrom.

For a better understanding of the invention, together with other and further objects thereof, reference is had to the following description taken in connection with the accomponying drawing and its scope will be pointed out in the appended claims.

In the drawing there is shown an apparatus for applying the method of the present invention. An evacuated chamber 2 of glass or other suitable material has positioned therewithin a rotatable member 4 such as a metal cylinder. Affixed to member 4 is a projecting finger 6 which is responsive to a magnetic field (not shown) applied to it from a point outside chamber 2 thereby permitting the rotation of member 4 by the movement of the magnetic field. A silicon semiconductor block 8 is pivotably mounted on member 4 as at 9 by any suitable means, such as a bracket. By this arrangement block 8 may readily be moved about a rotary axis. Opposing and spaced from block 8 is an electron source 12 which may be a thoriated tungsten emitter or other suitable electron emitting device. An assembly 14 including a heating unit 15 for heating an impurity 16 contained therein is positioned within chamber 2 and spaced from member 4 preferably in substantially the same plane as electron source 12. Heating unit 15 may be energized by any suitable source connected across heater terminals as at 18 and 20. It is to be understood that assembly 14, member 4 and electron source 12 are supported within chamber 2 by upright posts or other means well known in the art (not shown).

In operation, assuming that it is desired to form a body of N-type silicon, a block of substantially pure silicon is rotatably mounted at 9 as described hereinabove on member 4 and a stream of electrons is directed at the surface of the block from electron source 12. This bombardment is continued for a short period such as about 5 to 10 minutes, the bombardment resulting in the removal of all contamination such as oxides, carbonates, etc. and leaving a pure silicon surface. Member 4 is now rotated by applying a moving magnetic field from outside chamber 2 to projecting finger 6 until the bombarded surface of silicon block 8 is located directly opposite impurity 16 which is a pentavalent element such as antimony, arsenic, bismuth, or phosphorus. Heating unit 15 is energized and the heat radiated therefrom serves to cause the evaporation of impurity 16 onto the bombarded surface of silicon block 8 with consequent diffusion thereinto. The amount of diffusion into and throughout block 8 of impurity 16 is proportional to the time that it is subjected to the evaporation of the impurity. Impurity 16 readily diffuses into silicon block 8, as the electron bombarded surface being clean of contamination, presents no barrier to the diffusion thereinto of the evaporated impurity. After the evaporation step is completed, member 4 is again rotated by means of finger 6, as hereinabove described, so that the surface of block 8 is once again opposite electron source 12. The resubjection of the surface to an electron bombardment removes the excess of impurity remaining thereon and there results a silicon body having an N-type conductivity. Of course, if it is desired to provide a silicon body having a P-type conductivity, the same procedure is followed except that the impurity is a trivalent element such as boron, aluminum, indium or gallium.

Assuming it is desired to provide semiconductive silicon body consisting of an N-type zone in junction with a P-type zone, the same method may be utilized except that the original silicon block used is of one type conductivity and the impurity is one that imparts the opposite type conductivity. For example, if the original block used is of N-type silicon, the impurity to be used is a trivalent element and if the original block is P-type silicon then the impurity to be used is a pentavalent element. Of course, where it is desired to form a body consisting of two different conductivity zones, the evaporation of the impurity is continued for a period long enough to permit only partial diffusion.

The method of the present invention may also be utilized to provide NPN or PNP silicon semiconductor bodies. In such a case, where an NPN body is desired, one surface of a P-type silicon block is subjected to electron bombardment, a layer of pentavalent impurity is evaporated thereon and diffused thereinto a predetermined distance and the surface is then bombarded to remove excess impurity. The silicon body is then turned so that its other surface is subjected to the same procedure viz, electron bombardment, impurity evaporation and diffusion, and electron bombardment. Where a PNP silicon body is desired the same procedure is followed except that the starting material is N-type silicon and the impurity is a trivalent element.

While there have been described what are at present believed to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A method of providing a silicon semiconductor body having a predetermined type conductivity comprising subjecting in a vacuum chamber a surface of a block of relatively pure silicon to an electron bombardment to remove oxides, carbonates and other contamination therefrom, and evaporating onto said bombarded surface in said vacuum chamber a significant impurity selected from the group consisting of trivalent and pentavalent elements whereby said impurity diffuses into and throughout said block.

2. A method as in claim 1 wherein said body is of P-type conductivity and said impurity is selected from the group consisting of boron, indium, aluminum, and gallium.

3. A method as in claim 1 wherein said body is of N-type conductivity and said impurity is selected from the group consisting of arsenic, antimony, bismuth, and phosphorus.

4. A method of providing a silicon semiconductor body consisting of a first type conductivity zone in junction with an opposite type conductivity zone comprising subjecting in a vacuum chamber a surface of a silicon block having said first type conductivity to electron bombardment to remove oxides, carbonates and other contamination therefrom, evaporating onto said bombarded surfaces in said vacuum chamber, for a predetermined time, a significant impurity selected from the group consisting of trivalent and pentavalent elements while said body is in said chamber to impart an opposite type conductivity onto the bombarded surface whereby the impurity diffuses into the block for a predetermined distance thereby providing two opposite type conductivity zones in junction in the block, and thereafter, again subjecting the surface in said vacuum chamber to electron bombardment to remove the excess of said impurity from the surface.

5. A method as in claim 4 wherein said block is of P-type conductivity and said impurity is an element selected from the group consisting of arsenic, antimony, bismuth, and phosphorus.

6. A method as in claim 4 wherein said block is of N-type conductivity and said impurity is an element selected from the group consisting of boron, aluminum, indium, and gallium.

7. A method of providing a silicon semiconductor body consisting of two zones of a first type conductivity and a third zone of a second type conductivity therebetween comprising subjecting in a vacuum chamber opposite surfaces of a silicon block of said second type conductivity to an electron bombardment to remove oxides, carbonates, and other contamination therefrom, evaporating onto said bombarded surfaces in said vacuum chamber a significant impurity selected from the group consisting of trivalent and pentavalent elements while said body is in said chamber to impart said first type conductivity whereby the impurity diffuses through said surfaces into the block to form a silicon semiconductor body consisting of two zones of said first type conductivity and a zone of said second type conductivity therebetween, and thereafter, again subjecting said surfaces in said vacuum chamber to electron bombardment to remove the excess of said impurity from said surface.

8. A method as in claim 7 wherein said semiconductor block is of P-type silicon, said impurity is an element selected from the group consisting of arsenic, antimony, bismuth, and phosphorus and said semiconductor body is an NPN type.

9. A method as in claim 7 wherein said semiconductor block is N-type silicon, said impurity is an element selected from the group consisting of boron, aluminum, indium, and gallium and said semiconductor body is a PNP type.

References Cited in the file of this patent

UNITED STATES PATENTS

| | | |
|---|---|---|
| 2,103,623 | Kott | Dec. 28, 1937 |
| 2,561,411 | Pfann | July 24, 1951 |
| 2,597,028 | Pfann | May 20, 1952 |
| 2,651,009 | Meyer | Sept. 1, 1953 |
| 2,656,287 | Longini | Oct. 20, 1953 |